US005565869A

United States Patent [19]
Brodie et al.

[11] Patent Number: 5,565,869
[45] Date of Patent: Oct. 15, 1996

[54] MULTIPLE SLOPE ANALOG-TO-DIGITAL CONVERTER HAVING INCREASED LINEARITY

[75] Inventors: Benjamin T. Brodie, Edmonds; John D. Witters, Everett, both of Wash.

[73] Assignee: Fluke Corporation, Everett, Wash.

[21] Appl. No.: 288,416

[22] Filed: Aug. 9, 1994

[51] Int. Cl.[6] .................................................. H03M 1/52
[52] U.S. Cl. ........................................ 341/168; 341/129
[58] Field of Search .................................... 341/128, 129, 341/166, 167, 168

[56] References Cited

U.S. PATENT DOCUMENTS

| | | | |
|---|---|---|---|
| 5,014,058 | 5/1991 | Horn | 341/166 |
| 5,216,426 | 6/1993 | Ishioka | 341/168 |
| 5,229,771 | 7/1993 | Hanlon | 341/166 |
| 5,289,187 | 2/1994 | Florin et al. | 341/166 |
| 5,321,403 | 6/1994 | Eng, Jr. et al. | 341/168 |

*Primary Examiner*—Marc S. Hoff
*Attorney, Agent, or Firm*—George T. Noe

[57] ABSTRACT

A multiple slope integrating analog-to-digital converter (ADC) includes an integrator and a comparator in which an input voltage to be measured is applied to a summing node at the input of the integrator during an integrate cycle, while at the same time positive and negative reference currents are selectively applied to the summing node by a controller which monitors the output of the comparator in order to come as close as possible to nulling the voltage magnitude at the output of the integrator. A controller keeps track of the charge that has been added to and removed from the integrator during the integrate cycle, and provides a coarse conversion value. The residual voltage is de-integrated to provide a fine conversion value, which is added to the coarse conversion value to provide a final value.

The switches which control selection of the positive and negative reference currents are implemented and operated in such a way that linear error due to current injected into the integrator is minimized, and increased conversion speed is exhibited. At any given time during the integrate cycle, only one switch at a time is ON.

5 Claims, 7 Drawing Sheets

5,565,869

MULTIPLE SLOPE ANALOG-TO-DIGITAL CONVERTER HAVING INCREASED LINEARITY

BACKGROUND OF THE INVENTION

This invention relates generally to analog-to-digital converters, and in particular to a multiple-slope integrating analog-to-digital converter having increased linearity.

Conventional multiple-slope integrating analog-to-digital converters (ADCs) have been developed because of the long time periods and perhaps relatively high voltage headroom required to charge and discharge the integrating capacitor in a dual-slope integrating ADC. In multiple slope integrating ADCs, quantities of charge are periodically removed or added (represented by slopes of known polarity and duration) during the integrate, or charge cycle (also known as the run-up cycle) so that an unknown input voltage is never large enough to saturate the integrator, and a relatively small charge remains on the integrating capacitor to be discharged during the de-integrate, or discharge cycle (also known as the run-down cycle). The charge removed or added during the integrate cycle is kept track of by counting slopes which represent the known quantities of charge removed or added, and accounted for in making the final determination of the value of the unknown voltage. The multiple slope techniques may also be applied during the de-integrate or run-down cycle to shorten the amount of time required to discharge the integrator capacitor, resulting an ADC with increased sensitivity and speed. Examples of multiple slope integrating ADCs are taught in U.S. Pat. No. 4,357,600 to Ressemeyer et al. and U.S. Pat. No. 5,321,403 to Eng et al.

Many of the problems associated with prior art multiple slope integrating ADCs stem from the large number of high-speed switching operations that occur in a short period of time, particularly during the integrate cycle. Prior art investigators found that by keeping the number of switching transitions constant for all measurements, and by alternating the condition of switches connecting positive and negative reference voltages to the integrator in a both on, both off sequence, non-linearities due to switch current injection could be minimized. Such switching operations result in a comparatively slow ADC, e.g. about six readings per second for an 8½-digit display.

SUMMARY OF THE INVENTION

In accordance with the present invention, an improved multiple slope analog-to-digital converter provides increased linearity with greater speed of operation.

The multiple slope ADC comprises an integrator followed by slope amplifier and a comparator in which an input voltage to be measured is applied to a summing node at the input of the integrator during an integrate cycle, while at the same time positive and negative reference currents are selectively applied to the summing node by a controller which monitors the output of the comparator in order to limit the voltage magnitude at the output of the integrator and to determine the order and sequence in which the positive and negative currents are applied. Thereafter, during a de-integrate cycle, the input voltage is disconnected while progressively shallower ramps are measured with a high-speed clock for greater resolution and accuracy.

The switches which control selection of the positive and negative reference currents are implemented in such a way that undesired current injection into the integrator summing node is minimized. That is, the switches are operated in a break-before-make fashion, and only one switch at a time provides a path to the integrator summing node from the positive and negative reference voltage sources. Both switches are never on at the same time during the integrate cycle, and they are both off when the controller looks at the comparator output. Both switches are, however, operated a constant number of times. A tally is kept of the switch transitions during the integrate cycle, and to keep the number of transitions even for both switches, transitions by the less-frequently operated switch are inserted during the both-references-off periods to keep the number of transitions equal. This operation results in increased linearity and a shorter integrate-cycle time.

The controller maintains the tally of the switching of reference currents and present comparator output, and from that information determines which reference to apply or not apply to the integrator summing node. Counters are provided separately to keep track of the length of time the respective positive and negative currents are turned on during the integrate cycle so that a coarse measurement of the unknown input voltage can be made. The de-integrate cycle, then, provides a fine measurement of the unknown input voltage, and is added to the coarse measurement made during the integrate cycle to provide the final measured value.

It is therefore one feature of the present invention to provide an improved multiple slope analog-to-digital converter having increased linearity.

It is another feature of the present invention to provide an improved multiple slope analog-to-digital converter in which the effects of cross-coupled switch charge injection are eliminated.

It is another feature of the present invention to provide an improved multiple slope analog-to-digital converter which can provide accurate measurements in a shorter time than heretofore accomplished.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
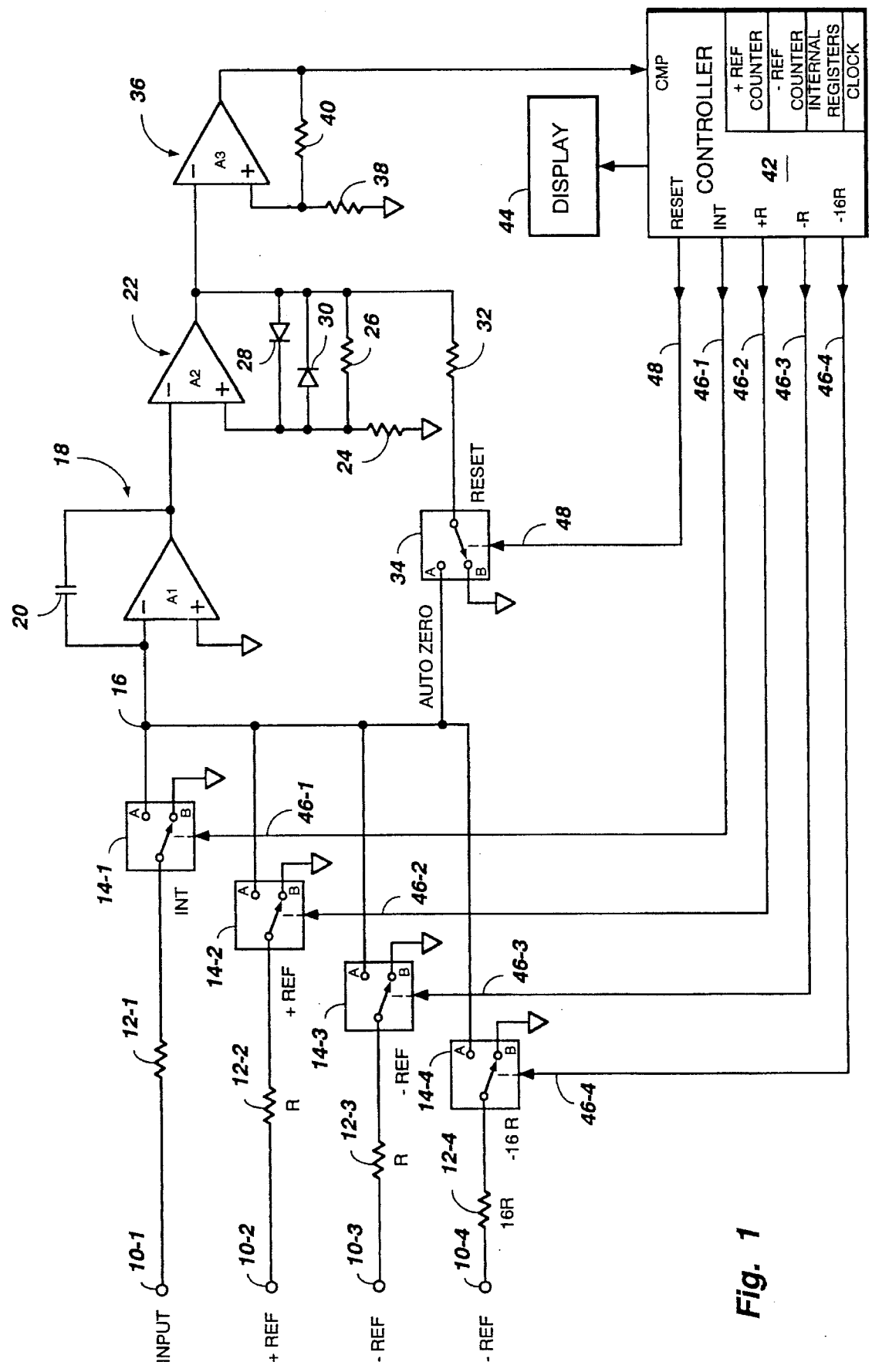
FIG. 1 is a schematic diagram of a multiple slope integrating analog-to-digital converter in accordance with the present invention.

Referring to FIG. 1 of the drawings, there is shown a multiple slope integrating analog-to-digital converter in which a voltage input to be measured is applied via an INPUT terminal 10-1, a resistor 12-1, and the closed contact (position A) of a switch 14-1 to a summing node 16. Other inputs to the summing node 16 include stable reference voltages +REF and –REF, which are nominally equal and of opposite polarity, applied via nominally equal-valued resistors 12-2 and 12-3 and switches 14-2 and 14-3, respectively, and reference voltage –REF applied via resistor 12-4 and switch 14-4, and will be discussed in detail later.

An integrator 18 comprising an operational amplifier (op amp) A1 having an inverting (–) input connected to summing node 16 and a non-inverting (+) input connected to a common potential such as ground, and a feedback capacitor 20 connected from its output to its –input, produces output voltage ramps whose slopes are proportional to and of opposite polarity to input voltages applied to summing node 16.

A slope amplifier 22 comprising an op amp A2 having a +input connected to the output of integrator 18 and a –input connected to the junction of gain-setting resistors 24 and 26, which are serially disposed between the output of op amp A2 and ground, amplifies the ramp voltage from integrator 18 (provides a steeper slope of the same polarity) to expand the ramp when it passes through zero volts and thereby increase the sensitivity of the comparator in the next stage;. A pair of diodes 28 and 30 are connected in opposite directions across resistor 26 to provide a voltage window of +0.6 volt and –0.6 volt to limit the output swing of the slope amplifier. The output of slope amplifier 22 is also connected through a resistor 32 and a switch 34 connected in the B position to ground during normal measurement operation, and upon reset (RESET), through resistor 32 and switch 34 connected in the A position to the summing node 16 to zero the output prior to a measurement cycle.

A comparator 36 comprising an op amp A3 having a –input connected to the output of slope amplifier 22 and a +input connected through a resistor 38 to ground switches states and produces a digital output whenever the output ramp from the slope amplifier 22 passes through a threshold near zero volts at the comparator input. A resistor 40 is connected from the +input to the output of op amp A3 to provide positive feedback to establish a few millivolts of hysteresis, separating the thresholds at which the positive-going ramps and negative-going ramps cause the comparator to switch, thereby preventing oscillation of the comparator due to indecision when very shallow ramps are applied to the input. Resistor 38 in an embodiment built and tested had a value of 10 ohms, while resistor 40 had a value of 1.07 kilohms. The digital output of comparator 36, because the input (integrator output) is applied to the –input, is low, or CMP=0 if the input is positive with respect to ground, and high, or CMP=1 if the input is negative with respect to ground. Thus, the comparator 36 output goes low, or CMP=0 for positive-going ramps that pass through a first threshold near zero volts and goes high, or CMP=1 for negative-going ramps which pass through a second threshold near zero volts. Of course, zero volts at the comparator input is the switching threshold if resistors 38 and 40 are omitted and the +input is connected to ground. Also, the logic would be inverted if the integrator output were inverted by the slope amplifier 22 or applied to the +input of the comparator 36.

A controller 42 controls operation of the multiple slope ADC by controlling the operation of switches 14-1 through 14-4 through a measurement cycle comprising an integrate cycle and subsequent de-integrate cycle and calculating the voltage reading to be displayed on an associated display device 44, which could be a resident cathode-ray tube or liquid crystal flat panel display, or an external display monitor or computer. In the preferred embodiment, controller 42 is an application-specific logic array programmed to perform as a state machine in accordance with an external 10 megahertz clock (divided down to 625 kilohertz for some of the switching operations) and programmed operating instructions which, in addition to providing instructions for determining voltage measurements, define a switching sequence algorithm for controlling the operation of the switches. As an alternative, with differences in timing taken into account, controller 42 could be a microprocessor.

The switches 14-1 through 14-4 and 34 in the preferred embodiment are commercially available 74HC4053 silicon-gate CMOS analog switches; however, as an alternative, such switches may suitably be implemented in integrated circuit form, or may be other commercially available analog switches. The switches are operated by control signals applied over control lines 46-1 through 46-4 and 48, respectively, from controller 42. All of the switches in FIG. 1 are shown with their respective contacts in the B position, and their respective A contacts open, so that, as shown, no current flows into summing node 16. Taking a closer look at any of the switches, for example, switch 14-2, it can be discerned that the B position is connected to ground, so that, in the example of switch 14-2, a constant current flows through input resistor 12-2. When a control signal arrives on line 46-2 from controller 42, switch 14-2 snaps to its A position, and now the current that was flowing to ground is diverted into summing node 16, resulting in no change in current flow through resistor 12-2. Moreover, the stable reference voltage supply +REF will not experience any change in load or output current flow, and will thus remain stable. To further reduce error introduced by the switches themselves, the number of switches required to provide full multiple slope integration has been kept to a minimum. For simplicity in describing the operation of the integrator, as far as current to the summing node 16 is concerned, the A position of switches 14-1 through 14-4 will be referred to as ON, and the B position of these switches will be referred to as OFF. Also, it should be noted that the +REF and –REF switches operate in what may be defined as a "break-before-make" operating mode. That is, before either the +REF or –REF is connected to the summing node 16, the other of +REF and –REF is disconnected.

A critical source of linearity errors in a multiple-slope ADC is switch charge injection. There are generally two typos of charge injection. One is charge injection resulting from the switch's own control signal, and the other is charge injection resulting the from the control of an adjacent switch. Error introduced by the first type of switch charge injection is eliminated by operating the switches a constant number of times over a fixed integration time interval T, independent of an input voltage to be measured, for all input levels, both positive and negative, as is well known by those skilled in the art. The other type of charge injection due to cross-coupling of control signals to adjacent switches is eliminated because at any given time that a control signal arrives to turn a reference voltage ON (switch 14-2 or 14-3 in the A position, both switches are OFF (in the B position). Thus, them is no conduction path into the summing node 16, and accordingly, no error introduced. The switching scheme of the present invention ensures that only one reference will be turned ON at a time.

Figure 2:
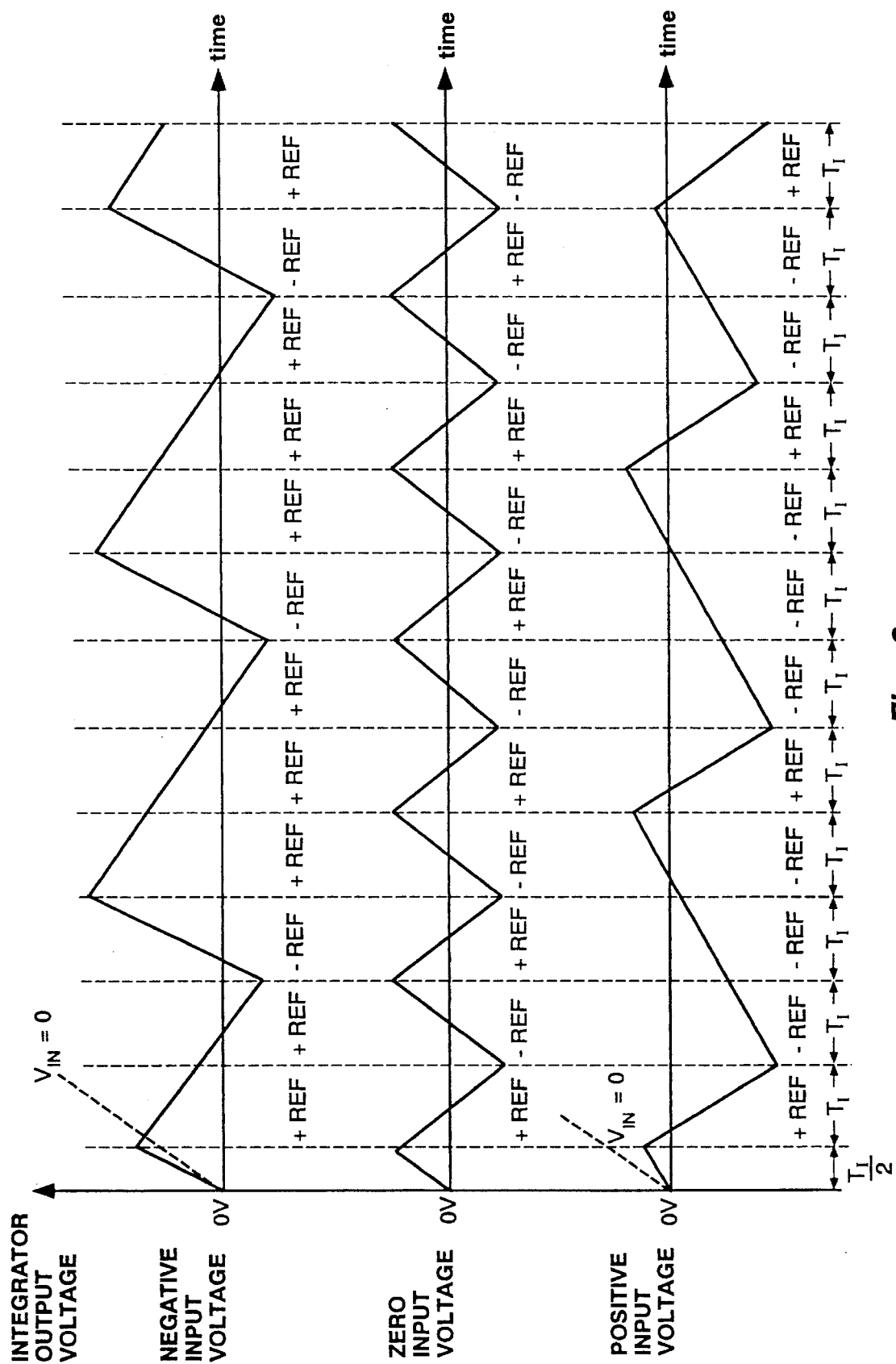
FIG. 2 is a set of waveforms of the integrator output voltage for negative, zero, and positive voltage inputs during a partial integrate cycle.

Before discussing the sequence of switching in accordance with the present invention, it is important to understand the basic operation of the multiple slope integrating ADC during an integrate cycle. FIG. 2 shows the output of integrator 18 in response to an applied negative, zero, and positive input voltages for a partial integrate cycle. An integrate cycle is one in which switch 14-1 remains in the A position for a fixed time period to allow an input voltage applied to input terminal 10-1 to place a charge on integrator capacitor 20, and switches 14-2 and 14-3 are operated a fixed number of times to connect negative and positive reference voltages −REF and +REF, depending on the output of comparator 36, to the integrator input for fixed periods of time $T_1$, resulting in addition or subtraction of charge on integrator capacitor 20 as exemplified by positive and negative ramps, respectively, at the output of integrator 18 to minimize the magnitude of voltage applied to amplifier 22. It can be seen in FIG. 2 that the negative reference voltage −REF is applied for the first one-half cycle to ensure that the integrator output voltage is positive with respect to ground in order for the multiple slope integrator to work. Also, if the integrator output voltage crosses the zero-volts baseline during a time period $T_1$, on the next time period the ramp reverses direction. On the other hand, if the integrator output voltage does not cross the zero-volts baseline during a time period $T_1$, on the next time period the ramp continues in the same direction.

Figure 3:
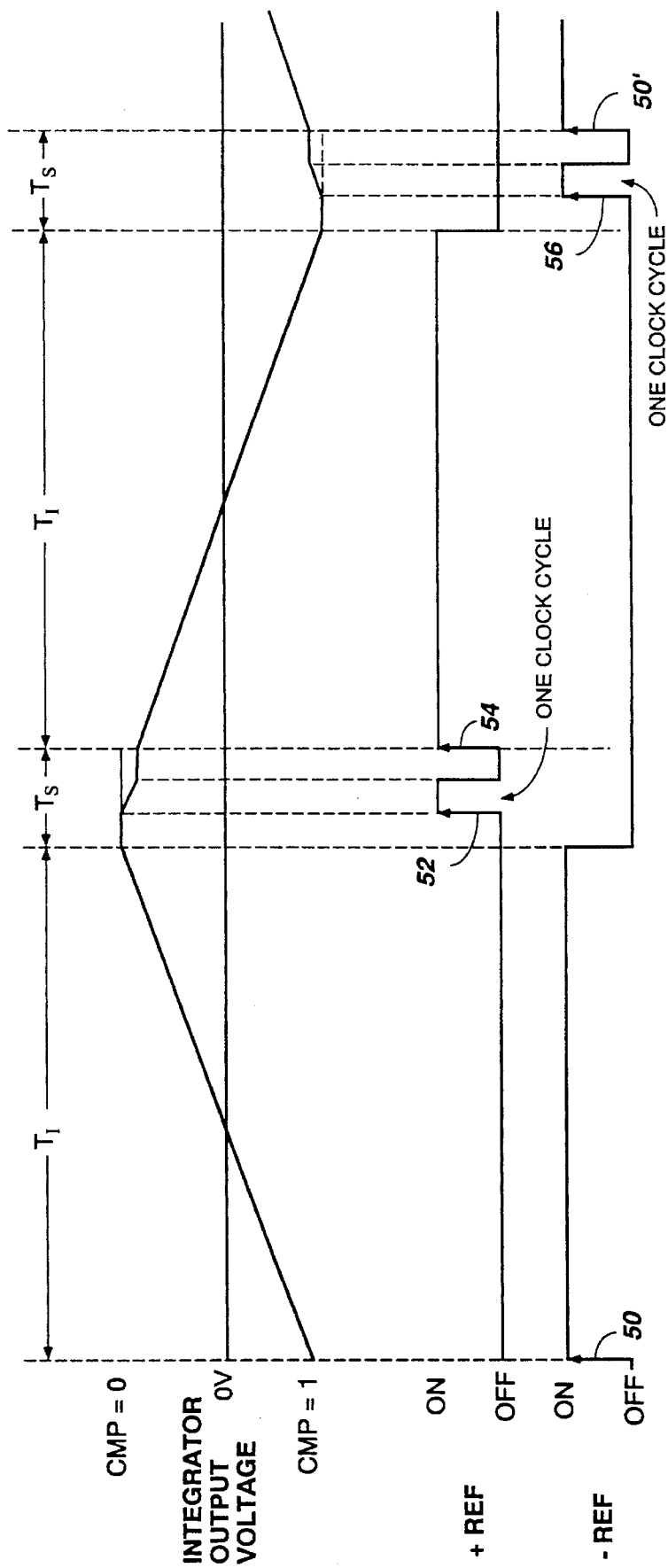
FIG. 3 is an expansion of the zero-volt waveform of FIG. 2 to show the detail of inserted clock transitions.

Refer now to FIG. 3, wherein for simplicity the zero-volt input of FIG. 2 is expanded. That is, the applied input voltage applied to INPUT terminal 10-1 is zero volts so that nominally equal and opposite polarity −REF and +REF voltages will be connected alternately throughout the integrate cycle. Picking a point somewhere in the integrate cycle and beginning first with an application of −REF connected via switch 14-3 to summing node 16 for a period $T_1$ while +REF is OFF, the output of integrator 18 is a positive-going slope. At the end of the first period $T_1$, −REF is turned off so that there is a short period of time $T_S$ when the −REF and +REF voltages are both disconnected from the summing node 16. This results in approximately zero current into the summing node 16, and hence, a "flat spot" on the integrator 18 output waveform. At the beginning of the next $T_1$ period, +REF is turned ON via switch 14-2 to summing node 16 while −REF is OFF, resulting in a negative-going slope at the output of integrator 18. At the end of the second $T_1$ time period, +REF is turned OFF so that there is another short period of time $T_S$ when both the +REF and −REF are OFF, creating another flat spot. The sequence continues until the integrate cycle is complete.

It is during the flat spots, or simply "flats," that controller 42 evens the tally between the number of +REF and −REF applications, or voltage transitions, to keep them even. In our example, −REF was first applied during the first period $T_1$, so the transition indicated by the arrowhead 50 injects an error current into the integrator. To compensate for this error, during the first flat period $T_S$, +REF will be turned on and back off for one clock cycle, inserting the transition indicated by the arrowhead 52 to cancel the error current injected earlier and thus keeping the number of transitions equal, signifying error compensation. Of course, this results in a negative-going slope for one clock cycle. Likewise, during the second flat period $T_S$, −REF will be turned on and back off for one clock cycle, inserting the transition indicated by the arrowhead 56 to cancel the error current injected by the transition indicated by arrowhead 54 and thus keeping the number of transitions equal, signifying error compensation. Of course, this results in a positive-going slope for one clock cycle. Thus, in effect, a compensating transition is inserted for every period $T_1$. Controller 42 keeps track of the number of compensating transitions inserted so that there is no loss of accuracy in the measurement. As an alternative, controller 42 could be programmed to wait until the integrate cycle is complete before inserting any compensating transitions, and just insert the number of transitions needed to provide the constant number of transitions for both the +REF and −REF; however, keep in mind that adding many transitions of one polarity at the end of the integrate cycle to even things up could result in a larger-than-desired residual voltage to de-integrate.

Also during the flats, controller 42 looks at the output of comparator 36 to determine the status of the ADC and deride which reference voltage next to apply to the summing node 16. That is, if the comparator output is a digital one (CMP=1), −REF is applied to drive the integrator output in a positive-going direction, and if the comparator output is a digital zero (CMP=0), +REF is applied to drive the integrator output in a negative-going direction.

Some desired conditions to be observed during the integrate cycle are (1) the total number of transitions of switches 14-2 and 14-3 must be constant; (2) each switch operates a constant number of times; and (3) switches 14-2 and 14-3 are operated to minimize the voltage magnitude at the output of integrator 18. During the de-integrate cycle, switch 14-1 contact A is opened, and switches 14-2, 14-3 and 14-4 are operated in such a way as to effect a de-integration or removal and measurement of the remaining charge on the integrator capacitor 20. The number of switch transitions in the de-integrate cycle must be constant as well.

Figure 4:
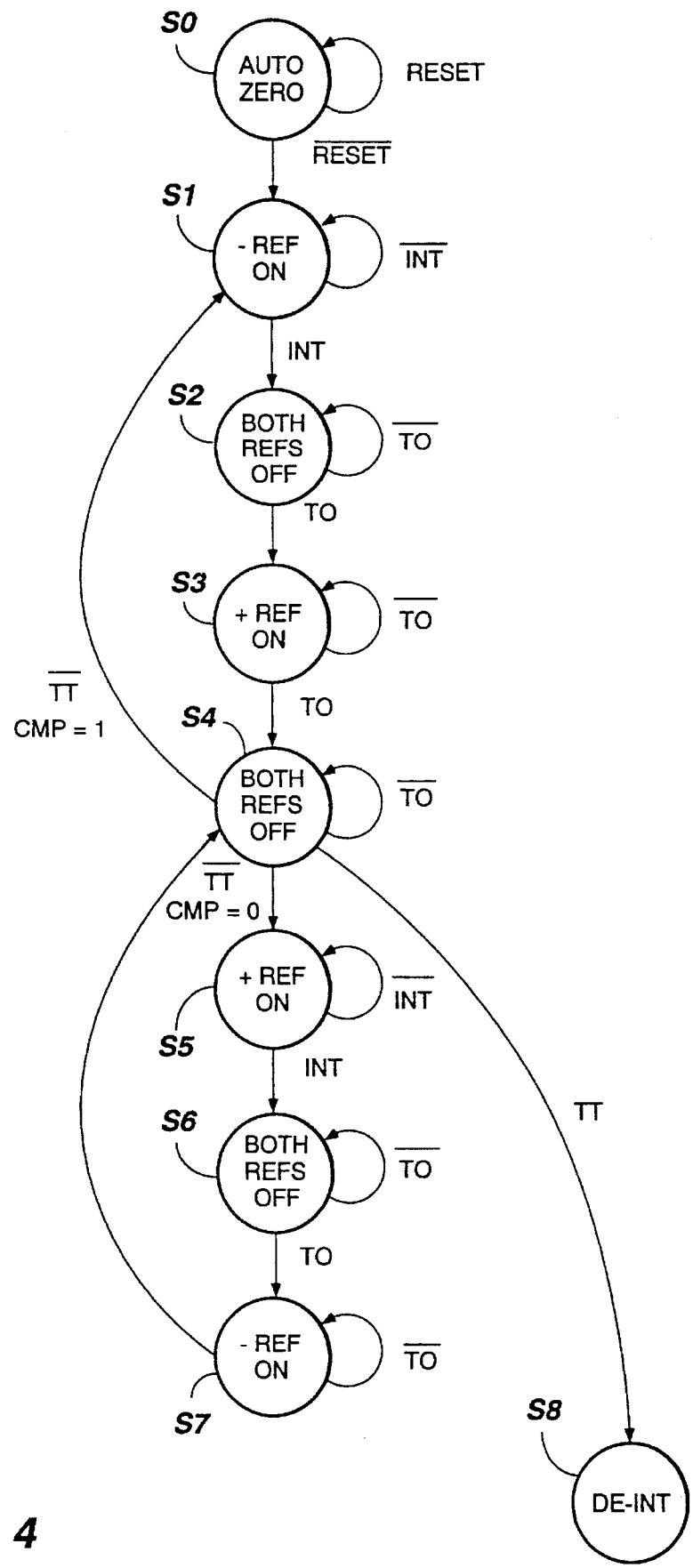
FIG. 4 is a state machine diagram for the integrate cycle.
Figure 5:
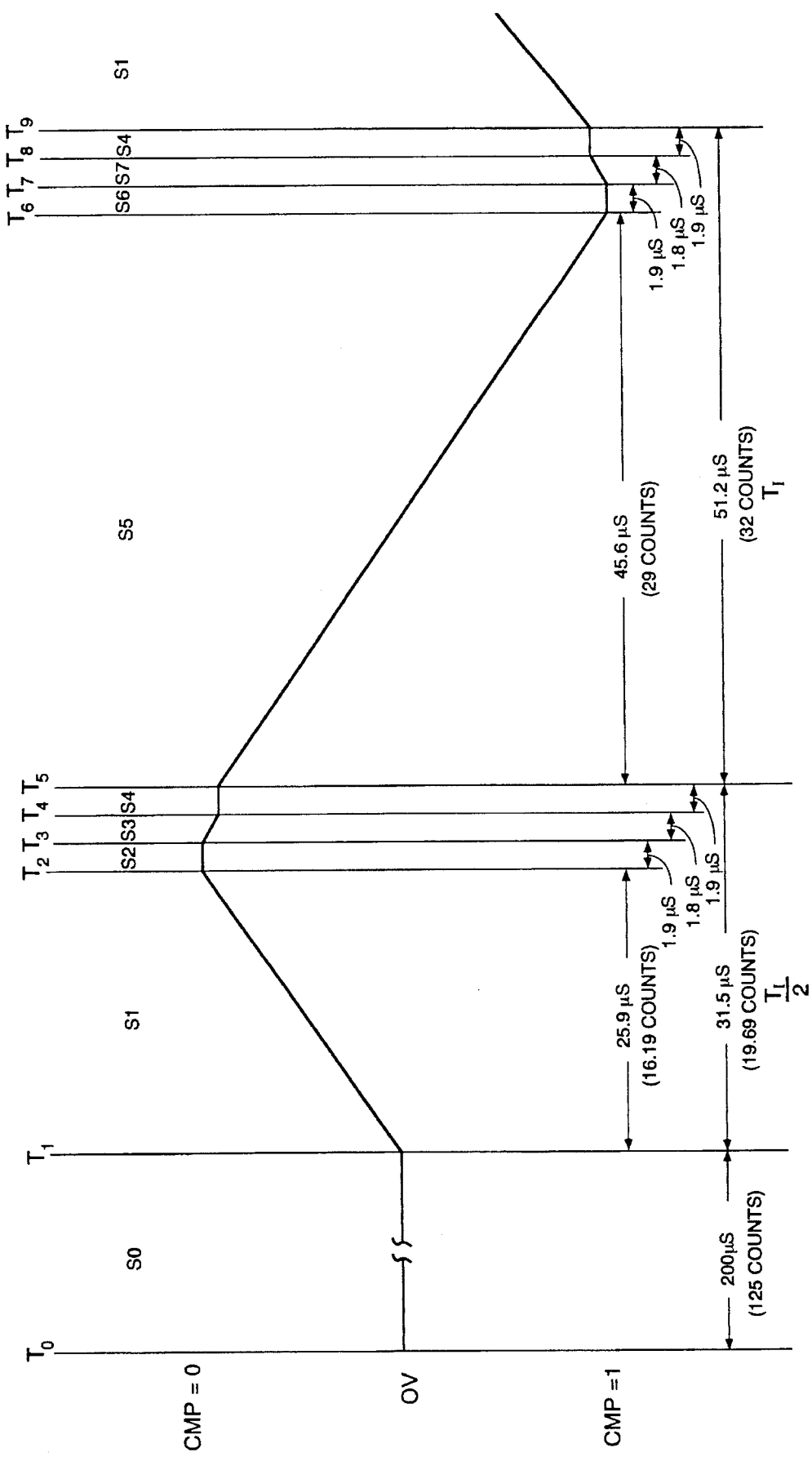
FIG. 5 is a waveform diagram of the integrator output voltage during the integrate cycle in association with the state machine operation of FIG. 4.
Figure 6:
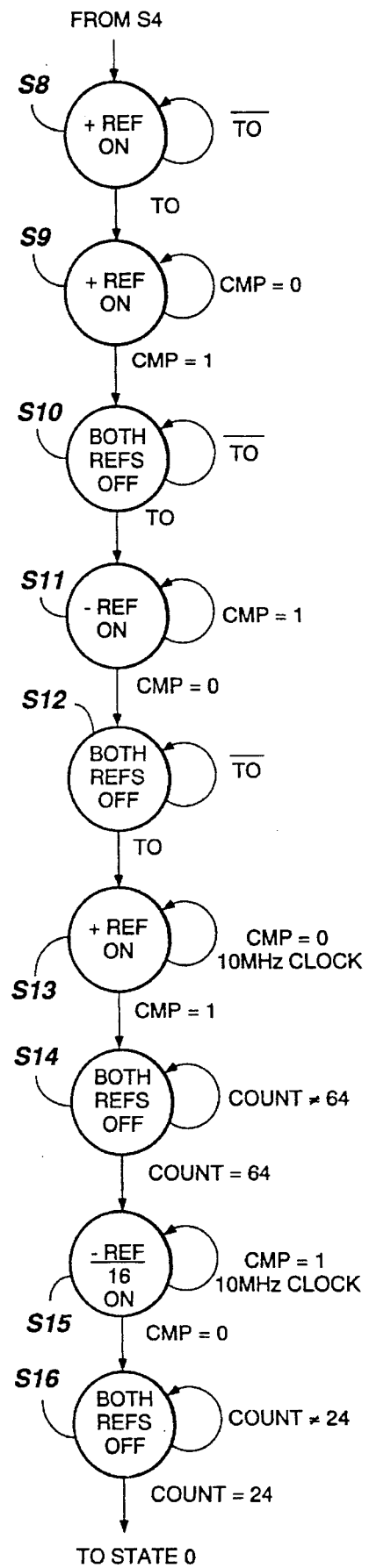
FIG. 6 is a state machine diagram for the de-integrate cycle.
Figure 7A:
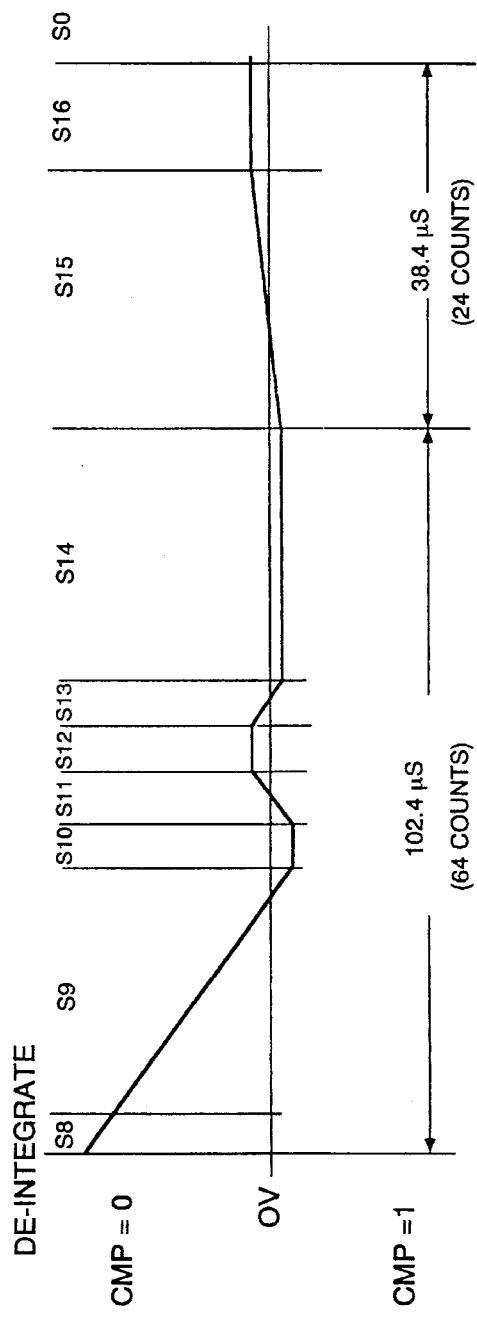
FIGS. 7A and 7B are waveform diagrams of the integrator output voltage during the de-integrate cycle for positive and negative residual voltages.
Figure 7B:
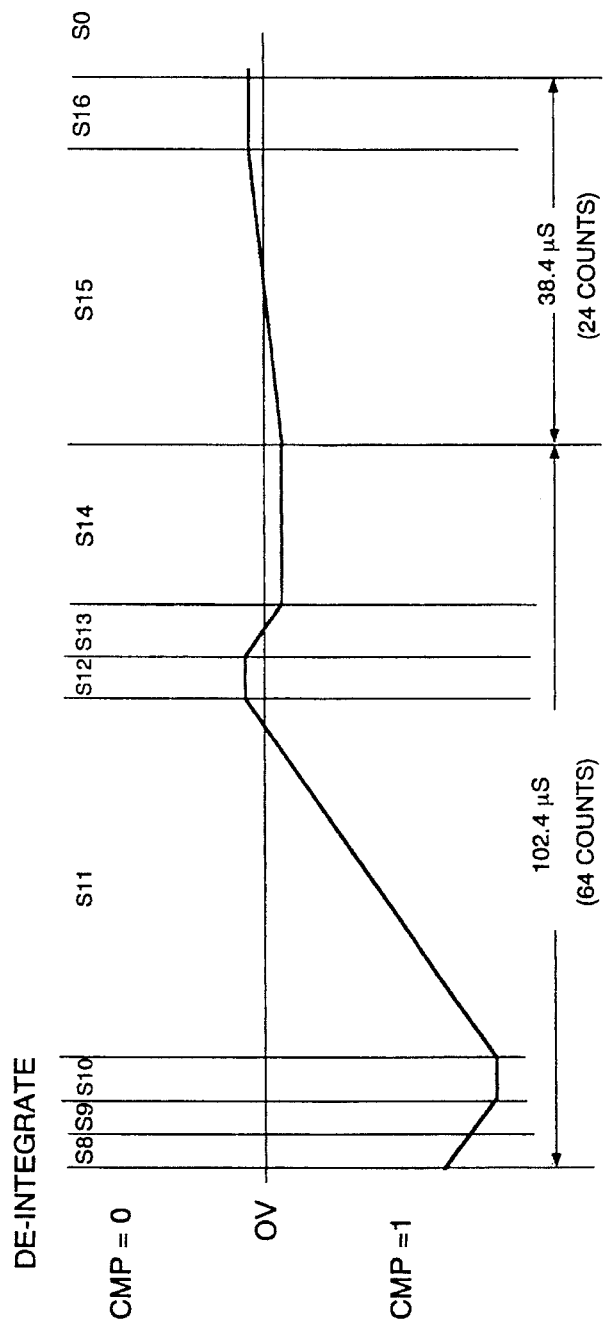

The operation of the multiple slope integrating ADC of FIG. 1 will be described in connection with one operating mode in which the multiple slope integrating ADC is capable of providing 1200 measurements per second to follow voltages that may be varying. Operation during the integrate cycle is in accordance with a state machine diagram as shown in FIG. 4. The waveform shown in FIG. 5 represents the operation of the circuit of FIG. 1 during an integrate cycle for a zero-volts input at input terminal 10-1. Operation during the de-integrate cycle is in accordance with a state machine diagram as shown in FIG. 6 and waveforms as shown in FIGS. 7A and 7B.

The state machine is driven by controller 42 in association with a 10-megahertz clock. The clock frequency is divided down to 625 kilohertz within controller 42 to establish "counts" equivalent to 1.6 microsecond intervals within the state machine in the following description to aid in understanding operation. An overall measurement cycle for this exemplary operating mode is 833.333 microseconds in duration, broken down as follows: an auto zero period is 200 microseconds duration (125 counts), an integrate period is 491.2 microseconds (307 counts), a de-integrate period is 140.8 microseconds (88 counts), and an additional 1.33 microseconds is absorbed in overhead. The counters that keep track of the total amount of time that the + and −REF are applied are operated by the 10-megahertz clock, providing 100 nanoseconds time resolution.

Referring now to FIG. 4, there is shown an operating algorithm associated with the programmed instructions of controller 42 for the auto zero and integration portions of the measurement cycle. The waveform in FIG. 5, in which the states and exact timing are indicated for the integrate cycle, should also be referred to so that a complete understanding of the operating algorithm can be attained in conjunction with circuit operation.

At state 0 (S0), which is the idle state for the state machine of controller 42, an auto zero or reset function of the ADC is performed to ensure that the output of integrator 18 is at zero volts before a measurement is started. Controller 42 performs the auto zero function by sending a reset (RESET) signal over line 48 to switch 34, setting it to position A so that capacitor 20 has a discharge path through the summing node 16, switch 34, and resistor 32 to the output of slope amplifier 22, whose output is held near ground. As long as no command to start a measurement is received, controller 42 will continue to idle at state S0, holding switch 34 its A position to perform the auto zero or reset function. All the internal registers associated with controller 42 are cleared in order to prepare for a new measurement. The idle state has a duration of 200 microseconds (125 counts) to allow complete reset to take place and for all of the voltages to settle before starting a new measurement.

Upon receipt of a start command signal from an external source, such as a push-button switch or a control circuit, or upon completion of a previous measurement if multiple measurements are automatically being provided, the state machine of controller 42 sequences on the next clock pulse to state 1 (S1). Controller 42 accesses an integrate command and at time $T_1$ simultaneously sends signals over lines 48, 46-1, and 46-3 to place switch 34 in its B position and to close switches 14-1 and 14-3 to begin integration of the input voltage while applying the –REF reference voltage. At the same time, an integrate timer is started to control the 491.2-microsecond integrate period. The constant current through resistor 12-3 is summed algebraically with the current through resistor 12-1, producing a positive-going ramp voltage at the output of integrator 18. The slope of the ramp is a function of the current at the summing node 16, and hence, into capacitor 20. The –REF is applied at the beginning of an integrate cycle to ensure that the output voltage of integrator 18 rises in a positive-going direction, as mentioned earlier in connection with FIG. 2. The state machine remains in state 1 for a predetermined time interval for the time interval $T_2-T_1$, which is 25.9 microseconds, or equivalent to 16.19 counts. As mentioned above, an internal counter operated by the 10-megahertz clock keeps track of this amount of time.

The state machine sequences to state 2 (S2) at time $T_2$, at which time the –REF voltage is turned off by placing switch 14-3 in its B position. Thus, in state 2, both references are turned off, but, of course, the input voltage remains connected for the entire integrate portion of the measurement cycle. Thus, the output of integrator 18 during time interval $T_3-T_2$ is a horizontal line for a zero volt input as shown in FIG. 5 (the integrator output is a negative-going ramp for a positive input voltage or a positive-going ramp for a negative input voltage). After a time-out period of 1.9 microsecond, the state machine sequences to state 3 (S3) at time $T_3$.

When the state machine sequences to state 3 (S3), controller 42 immediately sends a control signal over line 46-2 to place switch 14-2 in its A position, connecting positive reference voltage +REF to the summing node 16 for 1.8 microsecond, after which, at time $T_4$, the state machine sequences to state 4 (S4), placing switch 14-2 in its B position, removing the +REF voltage from the summing node 16. The purpose of turning +REF on at time $T_3$ is to compensate for any error current injected by the turning on of –REF at time $T_1$, as was explained in connection with FIG. 3.

During state 4 (S4), the controller 42 reads the output of comparator 36 and an internal counter that keeps track of the overall time during the integrate period in order to establish the next state to sequence to. If the total integrate time (TT) of 491.2 microseconds has not been reached by the end of state 4, and the output of the comparator is positive (CMP= 1), the state machine will sequence back to state 1 (S1). If the total integrate time has not been reached by the end of state 4, and the output of the comparator is negative (CMP= 0), the state machine will sequence to state 5 (S5). If the total integrate time has been reached, the state machine will sequence to state 8 (S8) to begin the de-integrate cycle.

The total length of time for S1 through S4 during the $T_1/2$ period at the beginning of an integrate period is 31.5 microseconds, which is equivalent to 19.69 counts. For subsequent S1–S2–S3–S4 sequences, as well as S5–S6–S7–S4 sequences, the time period $T_1$ is 51.2 microseconds, which is equivalent to 32 counts. Separate counters are provided to count the total length of time each of the reference voltages –REF and +REF are turned on throughout the integrate cycle, as discussed earlier, in order to accurately measure the unknown input voltage.

When the state machine sequences to state 5 (S5), reference voltage +REF is turned on, connected via switch 14-2 to the summing node 16, resulting in a negative-going slope at the output of integrator 18 for the time interval $T_6-T_5$, which is 45.6 microseconds (equivalent to 28.5 counts).

The state machine sequences to state 6 (S6) at time $T_6$, at which time the +REF voltage is turned off by plating switch 14-2 in its B position. Therefore, in state 6, both references are turned off while the input voltage remains connected to summing node 16. The output of integrator 18 during time interval $T_7-T_6$ is a horizontal line for a zero volt input as shown in FIG. 5. After 1.9 microsecond, the state machine sequences to state 7 (S7) at time $T_7$.

When the state machine sequences to state 7 (S7), controller 42 immediately sends a control signal over line 46-3 to place switch 14-3 in its A position, connecting negative reference voltage –REF to the summing node 16 for 1.8 microsecond. At time $T_8$, the state machine sequences to state 4 (S4), plating switch 14-3 in its B position, removing the –REF voltage from the summing node 16. As discussed hereinabove, the purpose of turning –REF on at time $T_7$ is to compensate for any error current injected by the turning on of +REF at time $T_5$.

At state 4 (S4) again, controller 42 looks at the output of comparator 36 and the status of the integrate timer. If the total integrate time at the end of state 4 is less than 491.2 microseconds, and if CMP=1, the state machine sequences to state 1 on the next clock cycle, and if CMP=0, the state machine sequences to state 5. When the integrate time indicates that the total integrate time (TT) of 491.2 microseconds has been reached (equivalent to 307 counts), the tally of transitions of the +and –REF voltages being turned on are checked and ensured to be equal, completing the integrate cycle. Thereafter, switch 12-1 is opened, disconnecting the input voltage from the summing node 16, and the state machine sequences to state 8 (S8) to begin the de-integrate cycle.

Refer to the state machine diagram of FIG. 6 in conjunction with the waveform diagrams of the FIGS. 7A and 7B for a complete understanding of the de-integrate cycle. At the end of the integrate cycle, the residual charge on capacitor 20 may be either a positive voltage as shown in FIG. 7A or a negative voltage as shown in FIG. 7B. In either case, in state 8, +REF is turned on for one clock cycle to start a negative-going slope by connecting the positive reference voltage +REF to summing node 16 through resistor 12-2 and switch 14-2 in its A position. Thereafter, the state machine sequences to state 9 (S9), and with REF still turned on, the output of the comparator 36 is sampled every 100 nanoseconds. As soon as CMP=1 is detected (which may be after 100 nanoseconds, as is the case shown in FIG. 7B where the integrator output is already negative with respect to ground), REF is turned off (switch 14-2 disconnected from its A position) as the state machine sequences to state 10 (S10). State 9 in which +REF is connected may last from one to 60 counts, depending on the amplitude of positive residual voltage left on the integrator 18 at the beginning of the de-integrate portion of the measurement cycle.

The state machine remains at state 10 with both references off for one clock cycle, then sequences to state 11 (S11).

In state 11, the negative reference voltage −REF is connected via switch 14-3 and resistor 12-3 to produce a positive-going ramp at the output of integrator 18. On each clock cycle driving the state machine, the output of comparator 36 again is checked. As long as CMP=1, indicating that the output of integrator 18 is negative with respect to ground, voltage −REF will remain connected. As soon as CMP=0 is detected (which may be after one clock cycle if the integrator output is near ground as shown in FIG. 7A), indicating the output of integrator is positive with respect to ground, −REF is turned off (switch 14-3 disconnected from its A position) as the state machine sequences to state 12 (S12). State 11 in which −REF is connected may last from one to 60 counts, depending on the amplitude of negative residual voltage left on the integrator 18 at the beginning of the de-integrate portion of the measurement cycle.

In state 12, both references are turned off for one clock cycle. At this point, the integrator output is positive with respect to ground in both FIGS. 7A and 7B. Then the state machine sequences to state 13 (S13).

In state 13 (S13), +REF is connected, causing a negative-going ramp at the output of integrator 18. The output of comparator 36 is sampled by the 10 megahertz clock, or every 100 nanoseconds, during state 13. As long as CMP=0, indicating that the output of integrator 18 is positive with respect to ground, voltage +REF will remain connected. As soon as CMP=1 is detected, indicating that the output of integrator is negative with respect to ground, the positive reference voltage +REF is disconnected from the summing node 16, so that both +REF and −REF are OFF, resulting in a hold state 14 (S14) that can also remain from one to sixty counts, depending on whet the residual voltage was at the beginning of the de-integrate cycle. The total time for the S8 through S14 sequence is 102.4 microseconds, or 64 counts of the 625-kilohertz sub-clock.

Once 64 counts have been completed, taking 102.4 microseconds, controller 42 sends a control signal over line 46-4 to place switch 14-4 in its A position, connecting negative reference voltage −REF to summing node 16 via resistor 12-4, which has a value 16 times greater than resistors 12-2 and 12-3. Accordingly, the current into summing node 16 is one-sixteenth that provided earlier through resistors 12-2 and 12-3 so that slope of the positive-going ramp at the output of integrator 18 is one-sixteenth as steep as the slopes discussed earlier. As long as the output of comparator 36 is low (CMP=1), indicating that the integrator 18 output is negative with respect to ground, −REF will continue to be applied via switch 14-4 to summing node 16 to remove the final charge from the integrator. The comparator output is sampled every 100 nanoseconds by the 10-megahertz clock, and when CMP=0 is detected, indicating that the output of integrator 18 has reached zero volts and the comparator has switched, controller 42 sends a control signal over line 46-4 to open switch 14-4, disconnecting negative reference voltage −REF from summing node 16 so that nothing is connected to summing node 16 and the output of integrator 18 remains fixed until the end of a predetermined period of time interval equal to 24 counts of the 625-kilohertz clock, or 38.4 microseconds.

Thereafter, controller 42 determines the value of the input voltage being measured by the ADC by totaling the counts in the +REF and −REF counters to determine the number of times each was ON, indicating approximately the amount of charge added or removed during the integrate cycle. This completes the measurement cycle, and controller 42 computes the final voltage for display on display device 44. On the next clock cycle, the state machine sequences to state 0.

It can be appreciated that component values and clock frequencies other than used for explanatory purposes herein may easily be implemented by one having ordinary skill in the art. Also, the order in which both references are on or off may be different than those described herein, as discussed earlier, as long as only one reference voltage at a time is applied to the input of the integrator.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. A multiple-slope analog-to-digital converter of the type having an operational amplifier integrator having a capacitive element coupled from an input summing node to an integrator output, and a comparator coupled to the integrator output, comprising:

a first switch coupled to an input terminal for connecting an input voltage to said summing node during an integrate cycle;

a second switch coupled to a first reference voltage for connecting and disconnecting said first reference voltage to and from said summing node during said integrate cycle;

a third switch coupled to a second reference voltage for connecting and disconnecting said second reference voltage to and from said summing node during said integrate cycle, said second reference voltage being substantially equal to said first reference voltage and of opposite polarity;

a controller for causing said second and third switches to operate in a sequence determined in response to an output from said comparator such that only one of said first and second reference voltages is connected to said summing node at a time during said integrate cycle, and ensuring that both said first and second switches are operated a predetermined constant number of times.

2. A multiple-slope analog-to-digital converter in accordance with claim 1 wherein said first, second, and third switches each provide a circuit path to said summing node in a first position and a circuit path to ground in a second position.

3. A multiple-slope analog-to-digital converter in accordance with claim 1 wherein said controller keeps a tally of the number of switch transitions made by said second and third switches and, when necessary, inserts a switch transition to keep said number of switch transitions even.

4. A multiple-slope analog-to-digital converter in accordance with claim 3 wherein said controller inserts said switch transition when one of said second and third switches is off.

5. A multiple-slope analog-to-digital converter in accordance with claim 1 further comprising means for determining respective total times said first and second reference voltages are connected to said summing node during said integrate cycle.

\* \* \* \* \*